(12) United States Patent
Uesaka et al.

(10) Patent No.: US 8,558,568 B2
(45) Date of Patent: Oct. 15, 2013

(54) CONNECTOR AND SEMICONDUCTOR TESTING DEVICE USING THE SAME

(75) Inventors: Ryo Uesaka, Yamato (JP); Jun Watanabe, Yamato (JP); Akinori Mizumura, Yamato (JP); Hirotaka Wagata, Tokyo (JP)

(73) Assignees: Molex Japan Co., Ltd., Yamato (JP); Advantest Corporation, Tokyo (JP)

( * ) Notice: Subject to any disclaimer, the term of this patent is extended or adjusted under 35 U.S.C. 154(b) by 328 days.

(21) Appl. No.: 13/110,526

(22) Filed: May 18, 2011

(65) Prior Publication Data

US 2011/0285415 A1 Nov. 24, 2011

(30) Foreign Application Priority Data

May 18, 2010 (JP) ................................. 2010-114461

(51) Int. Cl.
*G01R 31/20* (2006.01)
(52) U.S. Cl.
USPC .................................................... 324/754.08
(58) Field of Classification Search
USPC ................. 324/754.01–754.3, 762.01–762.1, 324/755.01–755.11; 257/48; 438/14–18; 439/63, 607.35
See application file for complete search history.

(56) References Cited

U.S. PATENT DOCUMENTS 6,890,215 B2 * 5/2005 Lang et al. ............... 439/607.35
7,850,488 B2 * 12/2010 Ikegami et al. .......... 439/607.05

FOREIGN PATENT DOCUMENTS

JP         H09-364455         7/1999

* cited by examiner

*Primary Examiner* — Tung X Nguyen
(74) *Attorney, Agent, or Firm* — Timothy M. Morella

(57) ABSTRACT

A ground terminal has a cylindrical main body. A signal terminal has a terminal main body that is disposed on the inside of the cylindrical main body, and a connecting plate portion that extends from an end portion of the terminal main body. Additionally, a ground terminal has at least three connecting plate portions that are disposed so as to encompass the connecting plate portion of the ground terminal, each extending from mutually different positions on an edge of the cylindrical main body.

15 Claims, 13 Drawing Sheets

CONNECTOR AND SEMICONDUCTOR TESTING DEVICE USING THE SAME

REFERENCE TO RELATED APPLICATIONS

The Present Disclosure claims priority to prior-filed Japanese Patent Application No. 2010-114461, entitled "Connector And Semiconductor Testing Device Using The Same," filed on 18 May 2010 with the Japanese Patent Office. The content of the aforementioned patent application is fully incorporated in its entirety herein.

BACKGROUND OF THE PRESENT DISCLOSURE

The Present Disclosure relates, generally, to a connector and a semiconductor testing device having the same, and, in particular, to technology for improving signal bandwidth by suppressing crosstalk and improving impedance matching.

Conventional connectors have been used for connecting a plurality of coaxial cables to circuit boards. Such connectors have signal terminals for connecting to the signal lines of the coaxial cable, and ground terminals for connecting to the shield lines of the coaxial cables.

Conventional cables include those wherein coaxial cables are connected in a direction parallel to the surface of the circuit board. An example of this is illustrated and described in Japanese Patent Application No. 09-364455, the content of which is hereby incorporated herein, by reference, in its entirety. In this type of connector, the signal terminals are disposed so as to be parallel to the circuit board, and the end portions thereof have connecting portions extending towards the surface of the circuit board. The end portions of the connecting portions are attached to conductor patterns on the circuit board. Additionally, some connectors have ground terminals which are formed coaxially and encompass the signal terminals. In such structures, a connecting portion is formed also on an edge of the ground terminal, where an end portion of the connecting portion is connected to the conductor pattern for the ground, formed on the circuit board.

However, in conventional connectors, there is only a single connecting portion for each ground terminal, in a structure that does not encompass the connecting portion of the signal terminal. Consequently, it is difficult to achieve excellent impedance matching, and a problem in crosstalk tends to occur. In particular, in recent years there has tended to be crosstalk in semiconductor testing devices due to the increase in signal frequencies.

SUMMARY OF THE PRESENT DISCLOSURE

The Present Disclosure is a result of contemplation on the problems set forth above. Accordingly, an object thereof is to provide a connector able to both suppress crosstalk and improve impedance matching, and to provide a semiconductor testing device having the same.

The connector as set forth in the Present Disclosure, in order to solve the problems set forth above, is preferably a connector provided on a circuit board, wherein the coaxial cable can be inserted along the direction of the surface of the circuit board. This connector can be provided with a ground terminal having a cylindrical main body wherein the centerline thereof is preferably oriented so as to face in the direction of insertion of the coaxial cable. Additionally, the connector may be provided with a signal terminal main body, disposed on the inside of the cylindrical main body, and a signal connecting portion, which is a connecting portion for connecting to the circuit board, extending from an end portion of the signal terminal main body. The ground terminal can act as a connecting portion for connecting to the circuit board, and has at least three ground connecting portions, each extending from mutually differing positions at the edge of the cylindrical main body, disposed so as to encompass the signal connecting portion. Additionally, a semiconductor testing device according to the Present Disclosure, in order to solve the problems set forth above, may preferably comprises the connector and a circuit board to which the connector is attached.

According to the Present Disclosure, the signal connecting portion is encompassed by at least three ground connecting portions, enabling a suppression of crosstalk and enabling an increase in impedance matching. Thus, in one form of the Present Disclosure, the ground terminal may have at least three ground connecting portions, having two first ground connecting portions formed in plate shapes, and two second ground connecting portions formed as plate shapes that face the two first ground connecting portions. Additionally, the signal connecting portion may be disposed between the two first ground connecting portions and the two second ground connecting portions. This form enables even more effective crosstalk suppression and enables an improvement in impedance matching. Note that there is no limitation to the number of the first ground connecting portions or the number of the second ground connecting portions.

Additionally, the two first ground connecting portions may extend from a position that is further from the surface of the circuit board than the two second ground connecting portions, and may cover the signal connecting portion. Doing so enables even more effective suppression of crosstalk and an improvement in impedance matching. That is, doing so enables a suppression of radiation of electromagnetic radiation from above the signal connecting portion.

Further, the two first ground connecting portions may have side portions positioned respectively at the left and right of the signal connecting portion, extending along the signal connecting portion. Doing so enables even more effective suppression of crosstalk. That is, doing so enables prevention of electromagnetic radiation, exiting from the signal terminal, from spreading in the crosswise direction. This can also improve impedance matching.

Additionally, the two second ground connecting portions may extend from a position nearer to the surface of the circuit board than the two first connecting portions. Moreover, the left and right edges of the two ground connecting portions may be positioned further to the outside than the left and right edges of the two first ground connecting portions. Doing so makes it possible to suppress the electromagnetic radiation that exits the signal terminal from radiating to a large range of the surface of the circuit board.

Further, the gap between the tip ends of the two second ground connecting portions may be larger than the gap between the tip ends of the two first ground connecting portions. Doing so makes the tip end of the second ground connecting portion more easily visible, thus making it easier to determine whether or not the tip end of the second ground connecting portion and the conductor pattern of the circuit board are connected properly.

Additionally, the cylindrical main body may include a first half-cylinder portion and a second half-cylinder portion which form a cylindrical shape when assembled facing each other in the radial direction of the cylindrical main body. Additionally, the first ground connecting portion may be formed in the first half-cylinder portion and the second ground connecting portion may be formed in the second half-cylinder portion. Doing so simplifies the manufacturing of the ground terminal when compared to the case wherein the first ground connecting portion and the second ground connecting portion are formed in a cylindrical main body formed monolithically.

Further, the cylindrical main body of the ground terminal may have a wall portion that blocks at least a portion of an opening of the cylindrical main body. This enables the suppression of radiation to the outside of electromagnetic radiation that exits the signal terminal main body.

Additionally, the connector may have, as ground terminals, a plurality of first ground terminals and a plurality of second ground terminals. Additionally, the at least three ground connecting portions possessed by each individual first ground terminal of the plurality of ground terminals, and the at least three ground connecting portions possessed by each of the second ground terminals of the plurality of ground terminals, may have the edge of the circuit board interposed therebetween. This form enables a simplification of the operations to attach the connector to the circuit board. Additionally, the ground connecting portions are able to improve the stability of the connection with the circuit board.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which:

FIG. 7 is a perspective view of the ground terminal in the connector of FIG. 1, wherein

DESCRIPTION OF THE PREFERRED EMBODIMENTS

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 1:
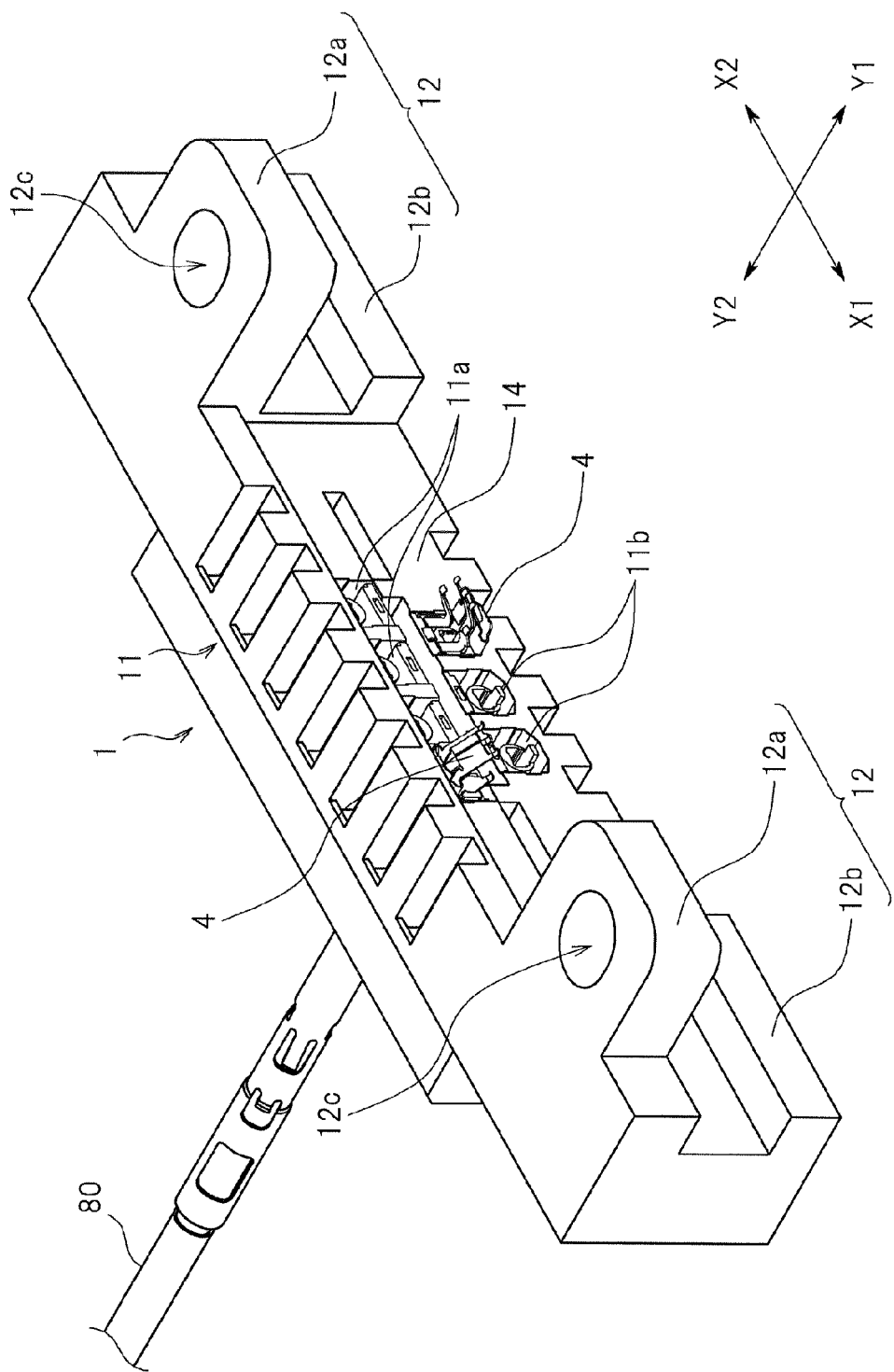
FIG. 1 is a perspective view of a connector according to the Present Disclosure.
Figure 2:
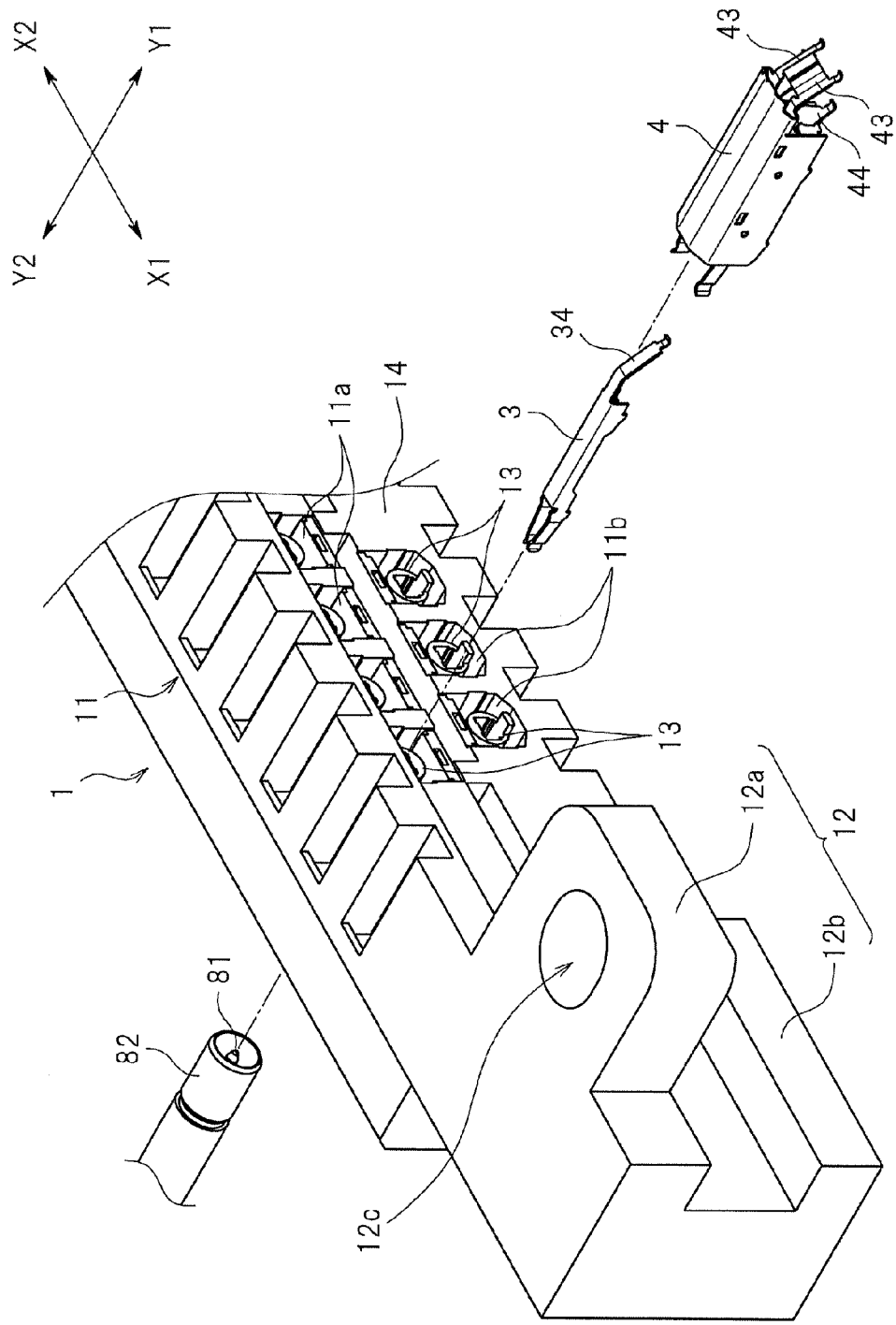
FIG. 2 is an assembly perspective view of the connector of FIG. 1.
Figure 3:
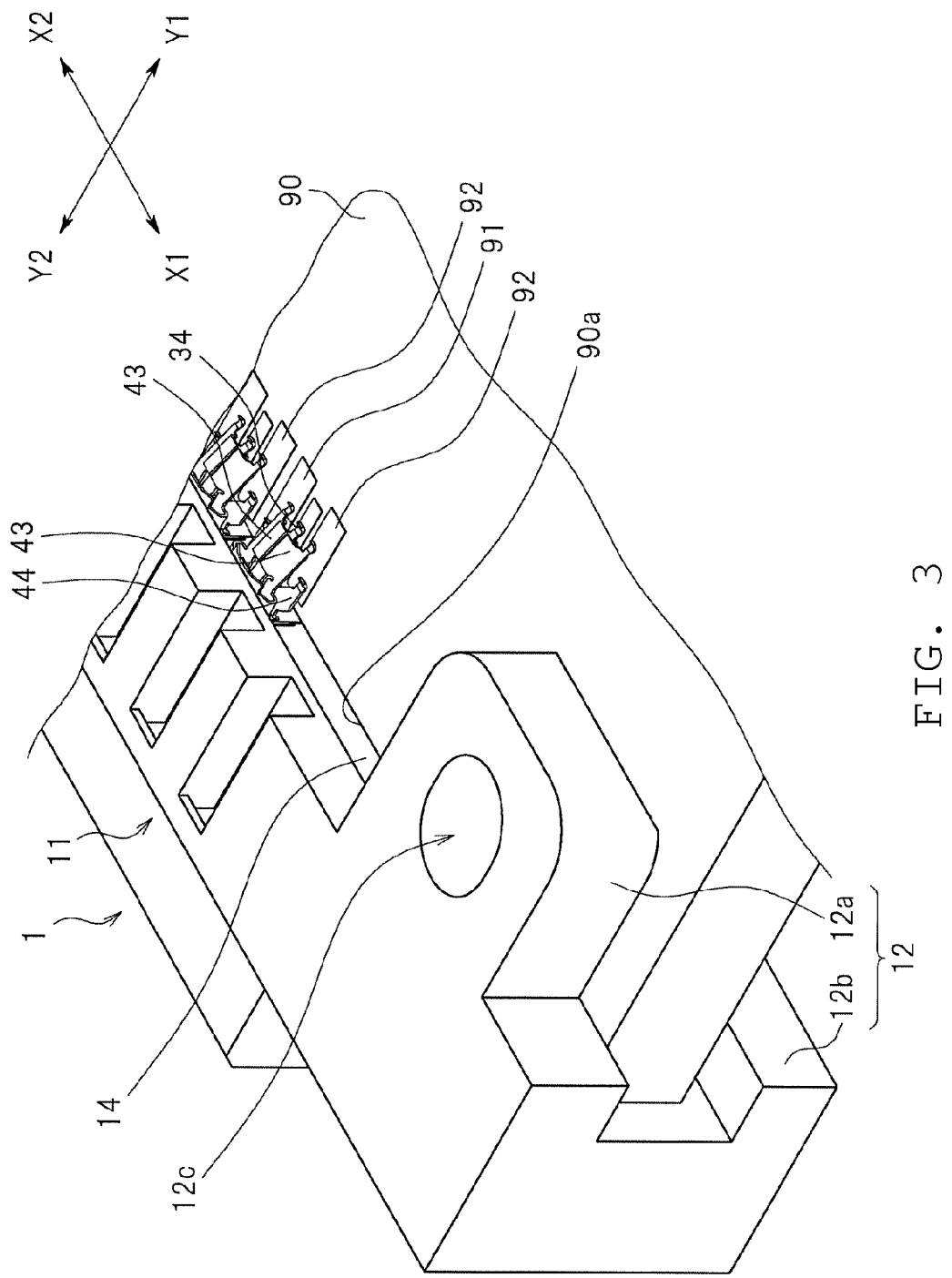
FIG. 3 is a view of the connector of FIG. 1, wherein a circuit board is attached thereto.

Referring to the Figures, the connector 1 is a connector for connecting a plurality of coaxial cables 80 to a circuit board 90 (see, especially, FIGS. 1 and 3). As illustrated in FIG. 2, the connector 1 comprises a plurality of signal terminals 3 for connecting signal lines of coaxial cables 80, a plurality of ground terminals 4 for connecting to the shield lines of the coaxial cables 80 and a housing 11 for containing the terminals 3 and 4.

The housing 11 is preferably an insulating member, and is preferably molded from a resin. As illustrated in FIG. 3, the housing 11 is a member long in the direction along the edge 90a of the circuit board 90 (which, in this explanation, is the left/right direction (the X-1-X 2 direction)). The connector 1 is a so-called card edge-type connector, and, as will be described below, is structured so as to being attachable to the edge 90a of the circuit board 90.

Figure 5:
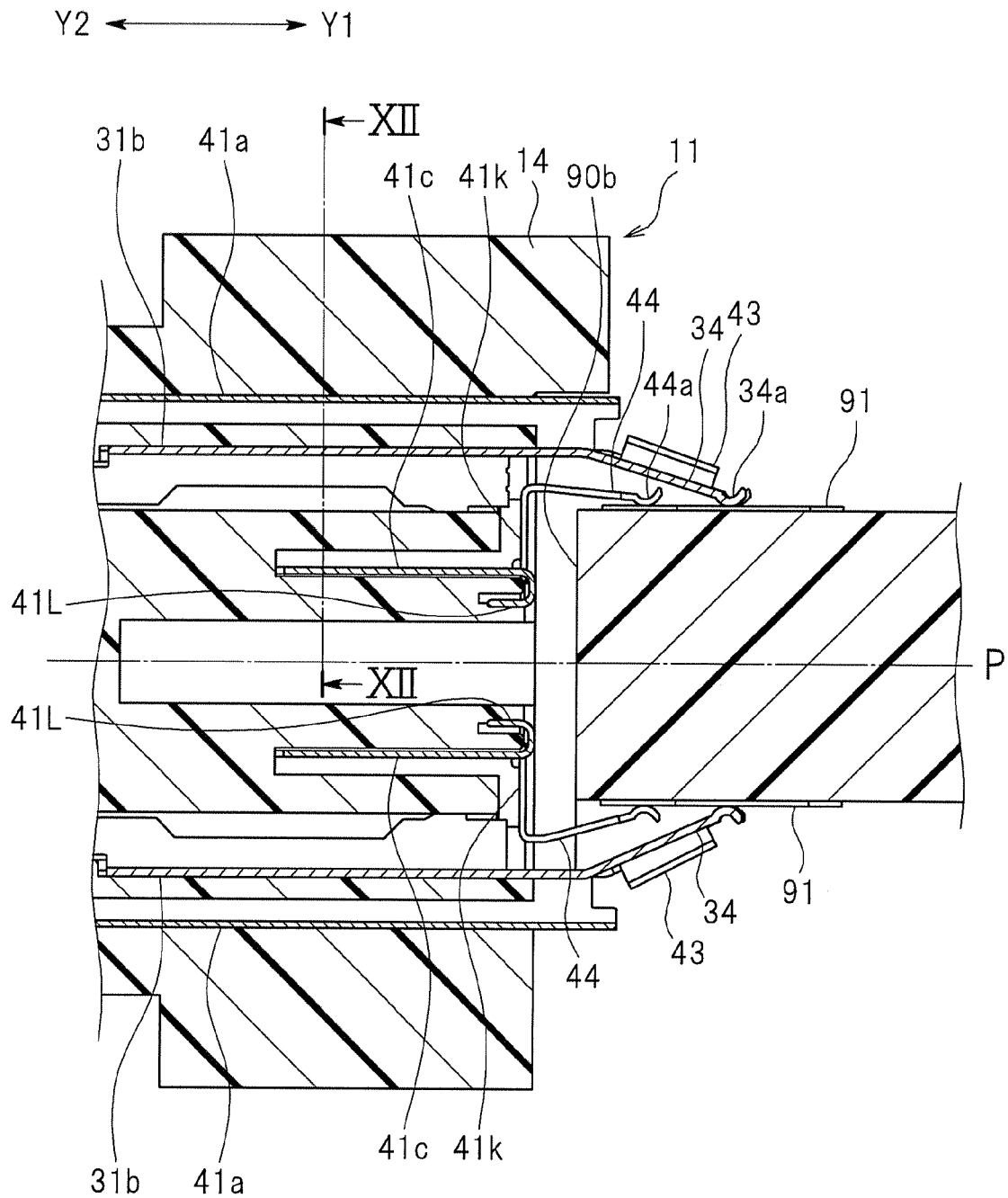
FIG. 5 is a cross-sectional view of the connector of FIG. 1, along Section V-V in FIG. 4.

As illustrated in FIG. 2, the housing 11 preferably has a main body portion 14, long in the left/right direction, that faces the side edge 90b (the surface that defines the thickness of the circuit board, shown in FIG. 5) of the circuit board 90. The main body portion 14 is preferably formed with a plurality of through holes 11a and 11b that pass through the main body portion 14 in the direction perpendicular to the side face 90b (which in this example, is the front/back direction (the Y1-Y2 direction)). The plurality of through holes 11a and 11b are lined up in the left/right direction. The signal terminals 3 and the ground terminals 4 are inserted into the individual through holes 11a and 11b.

Figure 4:
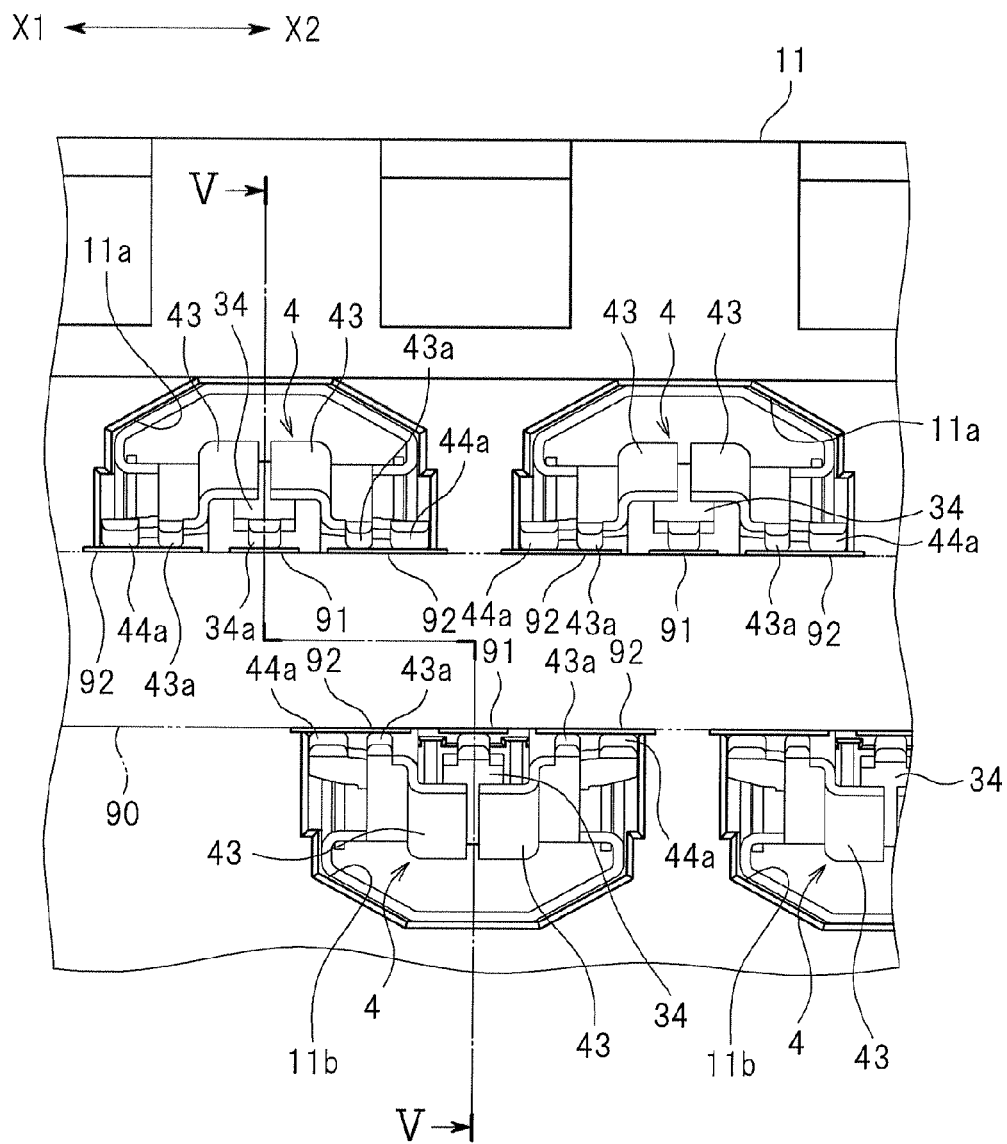
FIG. 4 is a plan view of a connector of FIG. 1, attached to the circuit board (illustrated by the double dotted line)

In the illustrated connector, the through holes 11a and 11b are preferably formed in two rows, lined up above and below. That is, the plurality of through holes 11a may be formed on the top side of the main body portion 14 and the plurality of through holes 11b may be formed at the bottom side of the main body portion 14. Additionally, as illustrated in FIG. 4, the top side through holes 11a and the bottom side through holes 11b are preferably lined up alternatingly in the left/right direction. That is, a through hole 11b may be positioned below the space between two adjacent through holes 11a. Similarly, a through hole 11a may be positioned above the space between two adjacent through holes 11b.

As illustrated in FIG. 5, the top side through hole 11a and the bottom side through hole 11b are preferably positioned on mutually opposite sides with the horizontal plane P that passes through the thickness-direction (which, in FIG. 5, is the up/down direction) of the center of the circuit board 90, and the connector 1 interposed therebetween. The result is that the plurality of terminals 3 and 4 that are inserted into the through holes 11a and the terminals 3 and 4 that are inserted into the through holes 11b are positioned on mutually opposite sides with the horizontal plane P interposed therebetween. Additionally, the terminals 3 and 4 inserted into the through holes 11a and the terminals 3 and 4 that are inserted into the through holes 11b are positioned in a form that is symmetric in relation to the horizontal plane P.

As illustrated in FIG. 4, conductor patterns 91 for carrying signals and conductor patterns 92 for the ground are preferably formed on both the upper face and the lower face of the circuit board 90. The signal terminals 3 inserted into the through holes 11a and the through holes 11b connect, respectively, to the conductor patterns 91 formed on the upper face and the conductor patterns 91 formed on the lower face. Additionally, the ground terminals 4 inserted into the through holes 11a and through holes 11b connect, respectively, to the conductor patterns 92 that are formed on the upper face and the conductor patterns 92 formed on the lower face.

Figure 7A:
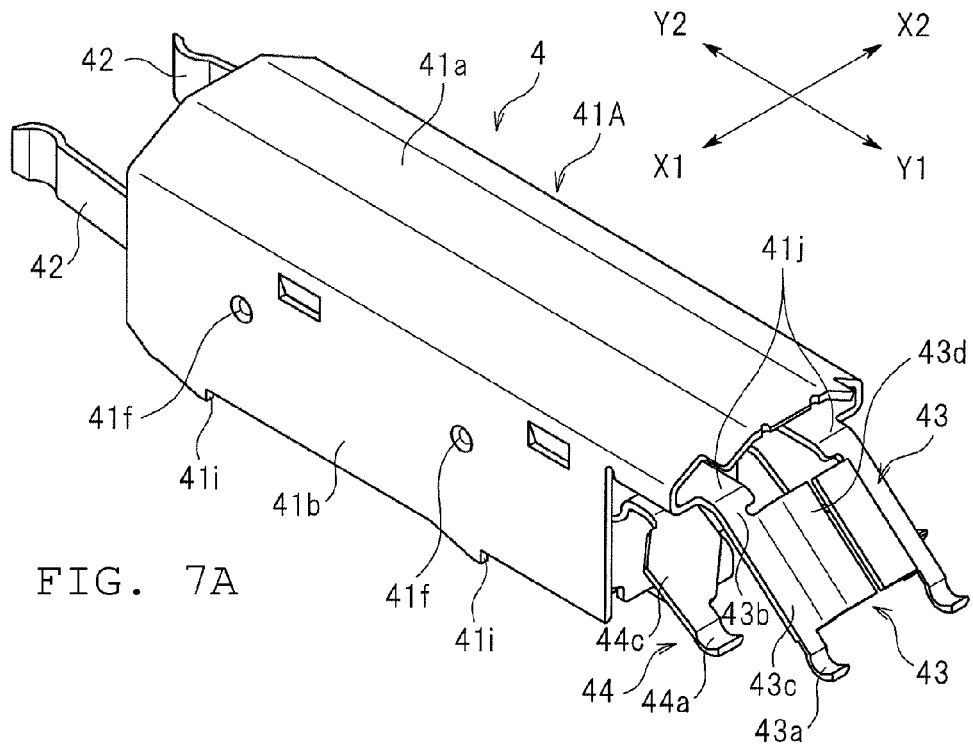
FIG. 7(a) illustrates the ground terminal when viewed from the upper oblique and FIG. 7(b) illustrates the ground terminal when viewed from the lower oblique.
Figure 7B:
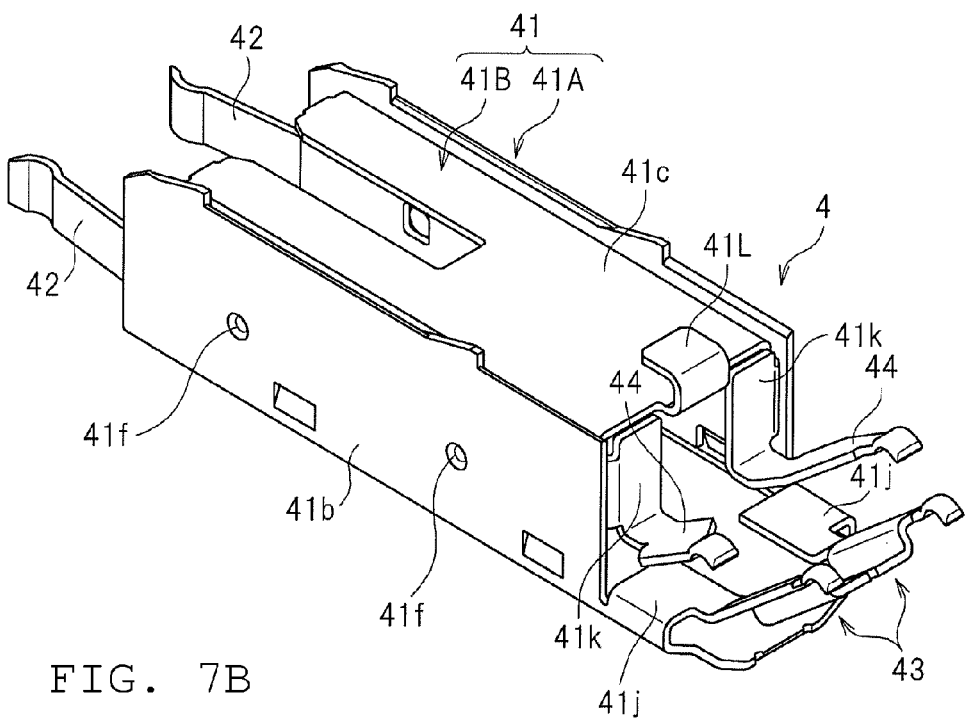
Figure 8:
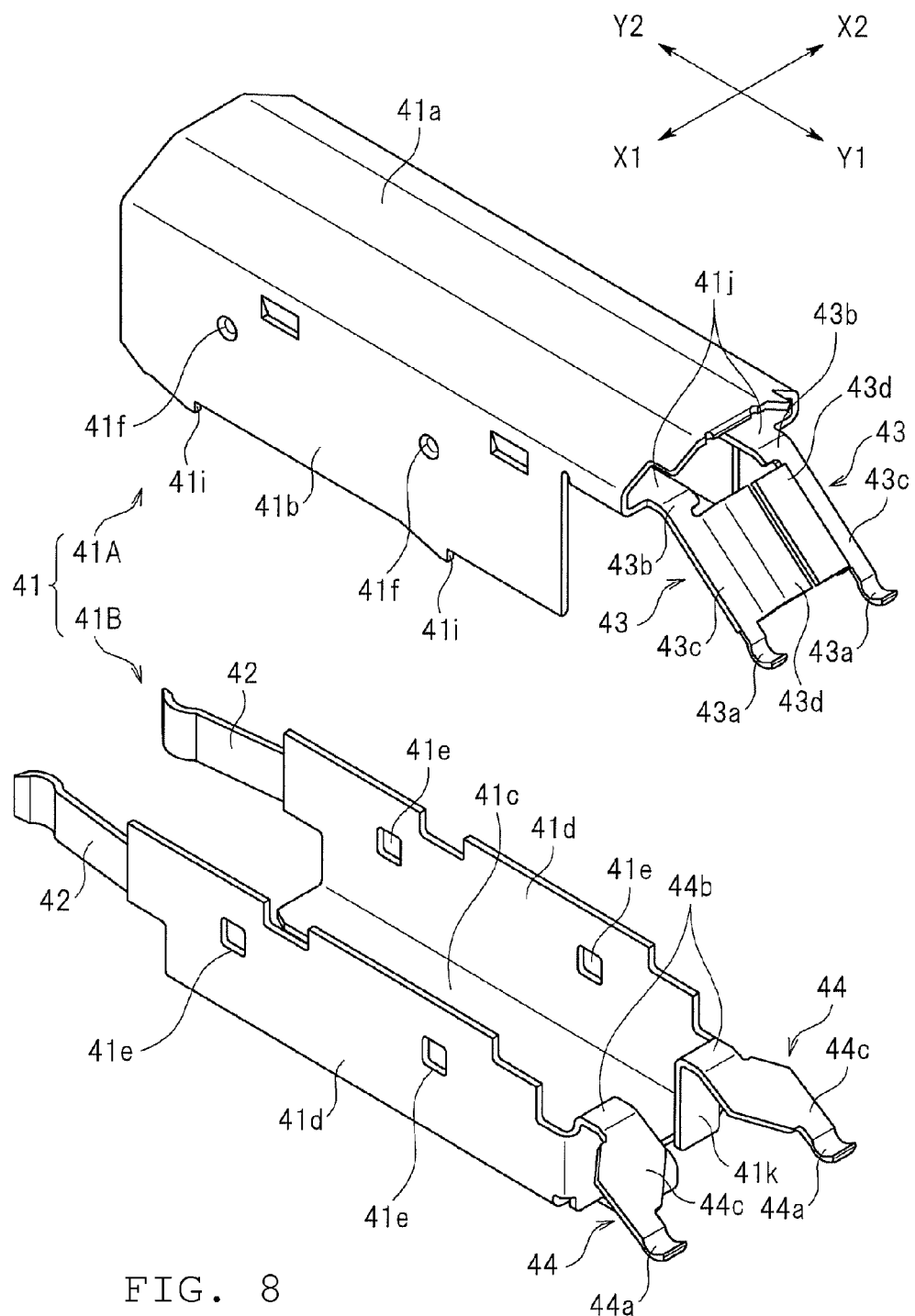
FIG. 8 is an assembly perspective view of the ground terminal of FIG. 7.

As illustrated in FIGS. 7-8, the ground terminals 4 preferably have cylindrical main bodies 41. Each cylindrical main body 41 preferably has an essentially square cross-section. As illustrated in FIGS. 1-2, the connector 1 is preferably a connector into which the coaxial cable 80 can be inserted in a direction along the surface of the circuit board 90; that is, in a direction parallel to the surface of the circuit board 90 (which, in this example, is the forward direction (the Y1 direction)). Because of this, the cylindrical main body 41 may be disposed so that the center line of the cylindrical main body 41 faces in a direction along the surface of the circuit board 90. Note that in this example, as will be described in more detail below, the coaxial cable 80 has a signal terminal 81 and a shield terminal 82 on an end portion thereof, where the signal terminal 81 and the shield terminal 82 are inserted into the connector 1.

Figure 6:
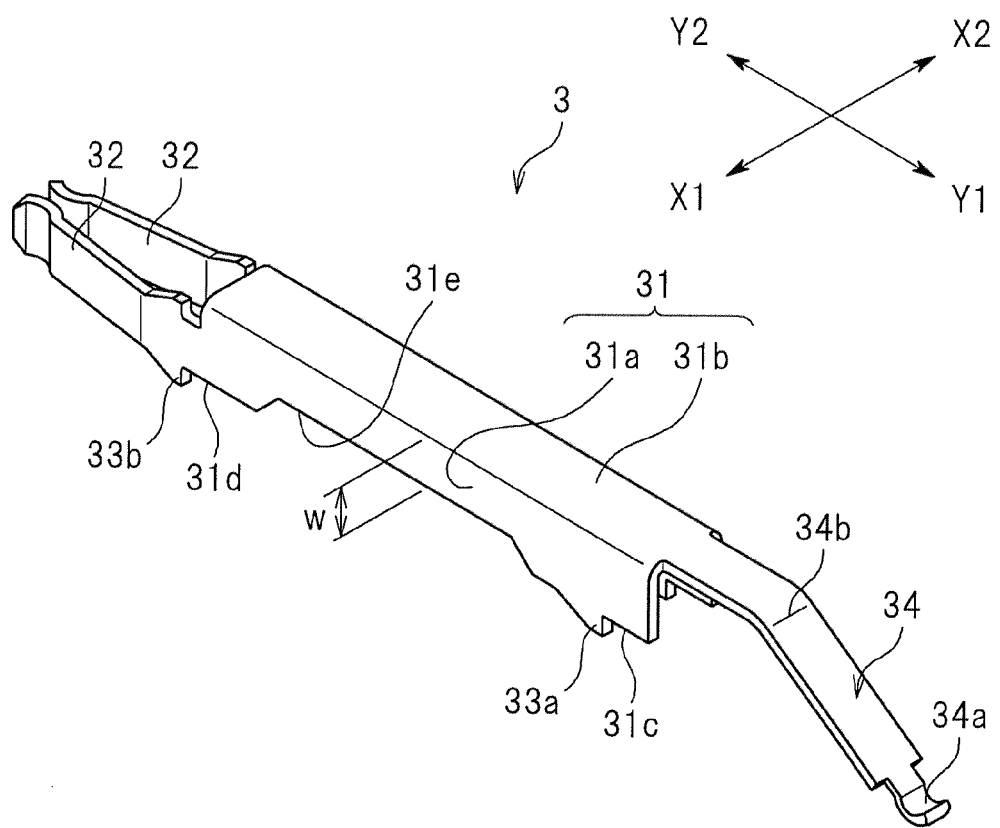
FIG. 6 is a perspective view of a signal terminal in the connector of FIG. 1.
Figure 12:
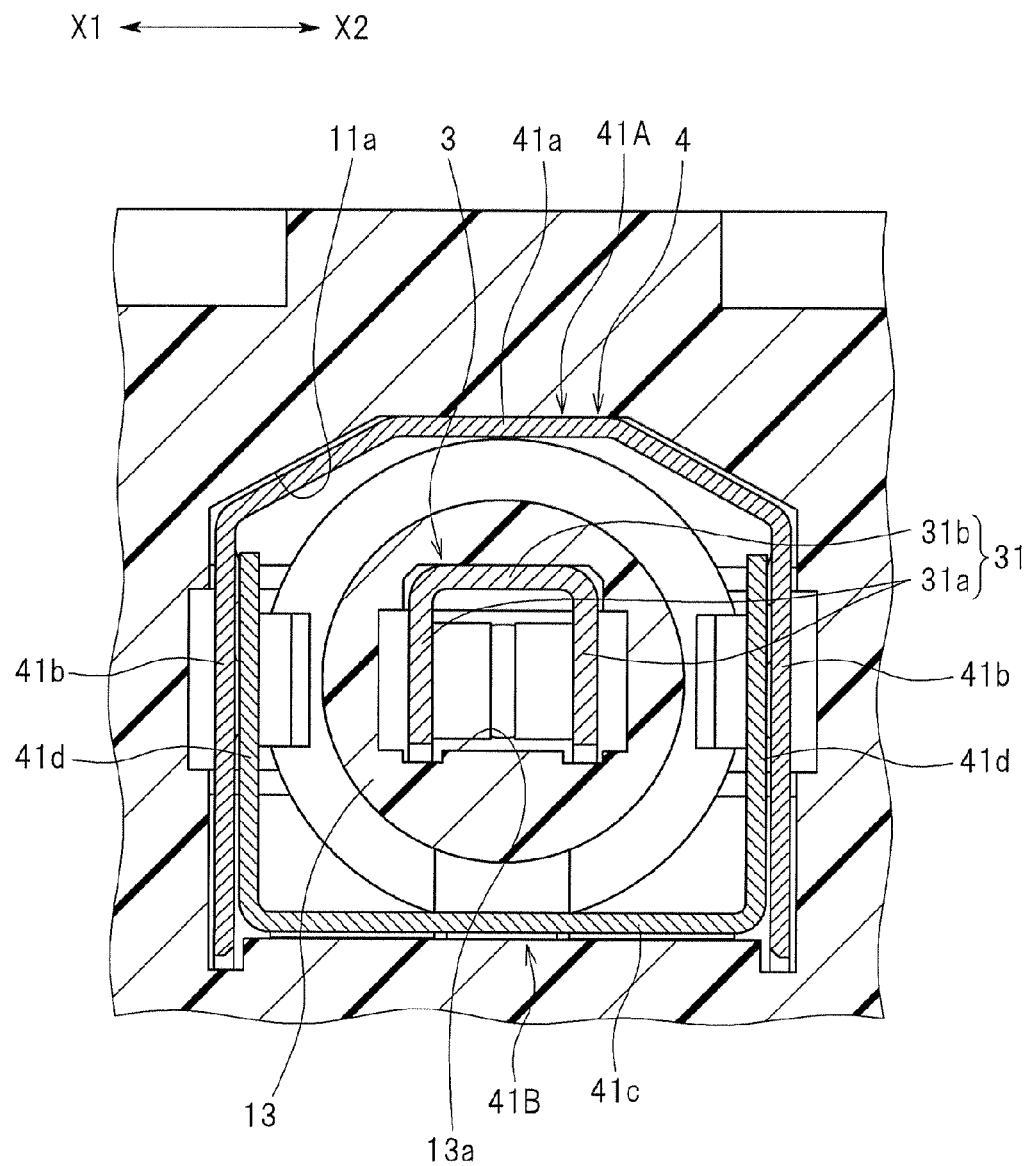
FIG. 12 is another cross-sectional view of the connector of FIG. 1, along Section XII-XII in FIG. 5.

As illustrated in FIGS. 6 and 12, a signal terminal 3 preferably has a terminal main body 31 disposed on the inside of the cylinder main body 41. The terminal main body 31 is preferably a part that is long in the direction of length of the cylinder main body 41; that is, in the direction along the surface of the circuit board 90. The terminal main body 31 preferably has a back wall portion 31b and left and right sidewall portions 31a, which face each other, bent back at the left and right edges of the back wall portion 31b. Accordingly, preferably, the terminal main body 31 has a cross-section that is essentially U-shaped. The terminal main body 31 may be disposed so as to be open in the direction of the horizontal plane P, described above. That is, the terminal main body 31 of a signal terminal 3 may be inserted into a top side through hole 11a is open facing downward, and the terminal main body 31 of a signal terminal 3 may be inserted into a bottom side through hole 11b is open facing upward.

As illustrated in FIG. 6, the signal terminal 3 preferably has contacting portions 32 that extend from each sidewall portion 31a in the direction that is opposite of the insertion direction of the coaxial cable 80 (the Y2 direction). The two contacting portions 32 may each be formed in the shape of leaf springs, and disposed so as to face each other. As illustrated in FIG. 2, the coaxial cable 80 has a pin-shaped signal terminal 81 at an end portion of a signal line. When the connector 1 is used, the signal terminal 81 may be inserted between the two contacting portion 32, and held between these two contacting portions 32. Doing so serves to achieve an electrical connection between the signal terminal 3 and the signal line of the coaxial cable 80.

As illustrated in FIG. 12, the housing 11 preferably has retaining portions 13 on the insides of the through holes 11a. A retaining portion 13 is preferably formed as an essentially cylindrical column. Additionally, a through hole 13a that passes through the retaining portion 13 in the front/back direction (that is, in the direction of insertion of the coaxial cable 80) may be formed in the retaining portion 13. The terminal main body 31 of a signal terminal 3 may be inserted into the through hole 13a.

As illustrated in FIG. 6, the signal terminals 3 preferably have a plurality of locking portions 33a and 33b for attaching on the inner surface of the through hole 13a. The locking portions 33a and the locking portions 33b may be formed at positions that are separate in the front/back direction. In this example, the locking portions 33a are formed on an edge 31c on one end side of the sidewall portion 31a, and the locking portion 33b is formed on the an edge 31d on the other end side of the sidewall portion 31a. The individual locking portions 33a and 33b may be formed with hooks shapes, so as to catch on the inner surface of the through hole 13a when the signal terminal 3 is inserted into the through hole 13a. Doing so secures the signal terminal 3 in the retaining portion 13.

As described above, the locking portions 33a and 33b are preferably formed at positions separate from each other on an edge of the sidewall portion 31a. Because of this, as illustrated in FIG. 6, most of the sidewall portion 31a is positioned between the locking portions 33a and 33b. The portion between the locking portions 33a and 33b can be used to perform adjustments to the impedance of the connector 1. Specifically, the width W of the portion between the locking portions 33a and 33b (that is, the height of the sidewall portion 31a between the locking portions 33a and 33b) can be adjusted as appropriate to adjust the impedance. In this example, a recessed portion 31e is formed in the edge of the portion between the locking portions 33a and 33b. Because of this, the width W may be reduced when compared to the width of the other portions of the sidewall portion 31a. In this way, the impedance of the connector 1 can be increased, when compared to a shape wherein this recessed portion 31e does not exist, through forming the recessed portion 31e in the signal terminal 3.

As illustrated in FIG. 6, the signal terminal 3 has a signal connecting portion, or connecting plate portion 34, for connecting to the conductor pattern 91 formed on the surface of the circuit board 90. The connecting plate portion 34 is preferably formed as a long thin plate shape. The connecting plate portion 34 extends in the direction of insertion of the coaxial cable 80 from the end portion of the terminal main body 31 (that is, the end portion on the side opposite from the contacting portion 32), and is angled towards the surface of the circuit board 90. In this example, the connecting plate portion 34 extends from the back wall portion 31b, angled towards the surface of the circuit board 90. The connecting plate portion 34 preferably has a contacting portion 34a for contacting the conductor pattern 91. The connecting plate portion 34 may be in a leaf spring shape, and may elastically deform, with a base portion 34b as a fulcrum, to change the angle thereof. The contacting portion 34a, through the elastic deformation of the connecting plate portion 34, is able to move in the up/down direction. When the connector 1 is attached to the edge 90a of the circuit board 90, the contacting portions 34a may push against the conductor patterns 1 through the elastic force of the connecting plate portions 34. Note that the contacting portion 34a may merely press against the conductor pattern 91, or may instead be soldered to the conductor pattern 91.

As described above, the terminal main body 31 of the signal terminal 3 may be disposed inside the cylindrical main body 41 of the ground terminal 4. The cylindrical main body 41, as illustrated in FIG. 8, may be structured from a first half-cylinder portion 41A and a second half-cylinder portion 41B. The first half-cylinder portion 41A and the second half-cylinder portion 41B may be formed so as to produce a cylindrical shape through being assembled together in the radial direction of the cylindrical main body 41 (which, in this example, is the up/down direction). Specifically, the first half-cylinder portion 41A and the second half-cylinder portion 41B may each be members having U-shaped cross sections. The first half-cylinder portion 41A may be disposed so as to be open facing towards the horizontal plane P, and the second half-cylinder portion 41B may be disposed so as to be open facing the direction opposite of that of the first half-cylinder portion 41A. That is, the first half-cylinder portion 41A and the second half-cylinder portion 41B may be disposed so as to face each other in the up/down direction.

Figure 13:
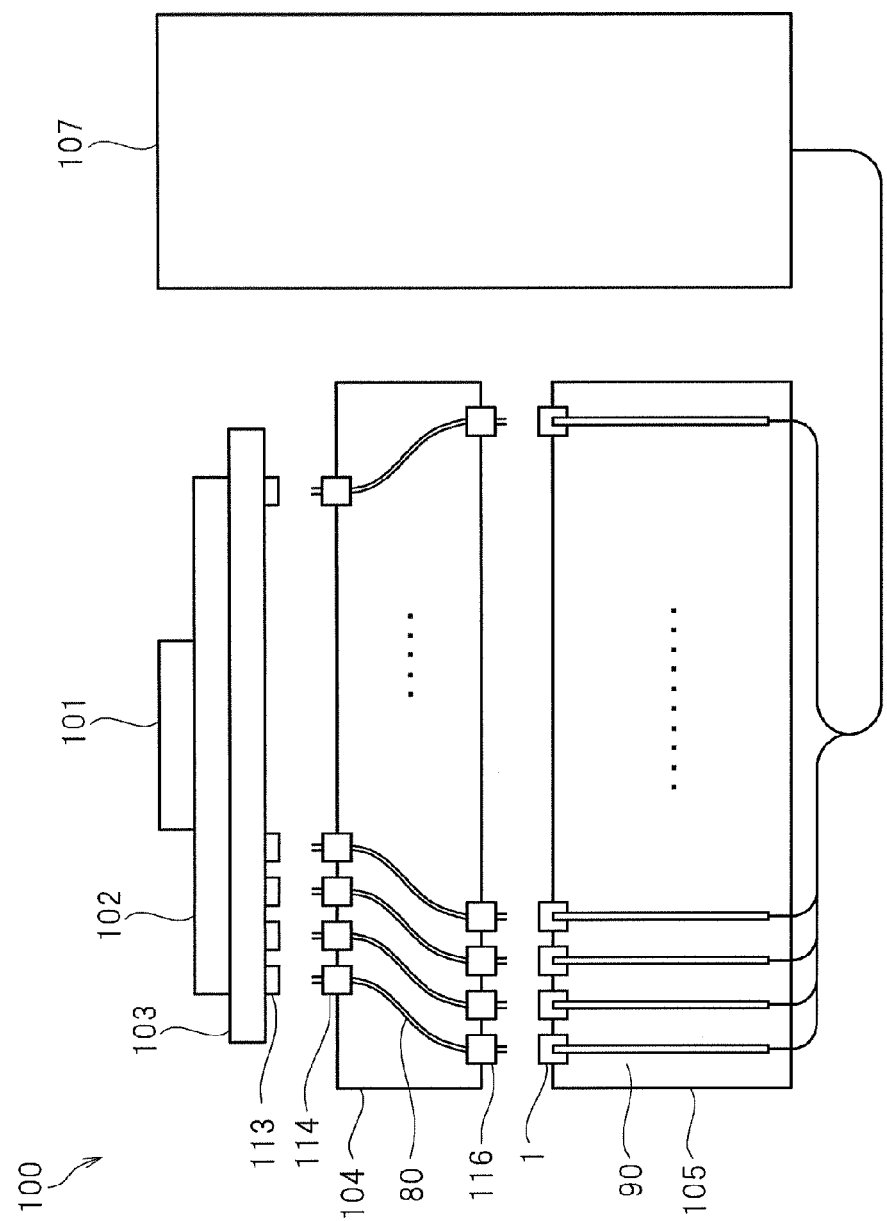
FIG. 13 is a schematic of a semiconductor testing device using the connector of FIG. 1.

As illustrated in FIG. 8 or 12, the first half-cylinder portion 41A has a ceiling plate portion 41a and left and right sidewall portions 41d that face each other in the left/right direction, extending downward from the left and right edges of the ceiling plate portion 41a. Further, the second half-cylinder portion 41B preferably has a bottom plate portion 41c that faces the ceiling plate portion 41a in the up/down direction. Additionally, the second half-cylinder portion 41B preferably has left and right sidewall portions 41d that face each other in the left/right direction, each extending upward from the left and right edges of the bottom plate portion 41c. As illustrated in FIG. 13, the sidewall portions 41d of the second half-cylinder portion 41B may fit into the inside of the first half-cylinder portion 41A. That is, the sidewall portions 41d of the second half-cylinder portion 41B may be positioned to the inside of the sidewall portions 41b of the first half-cylinder portion 41A, and disposed so as to overlap with the sidewall portions 41b.

As illustrated in FIG. 2, a tube-shaped shield terminal 82 may be provided on an end portion of the shield line of the coaxial cable 80. As illustrated in FIG. 8, the ground terminal 4 preferably has a pair of contacting portions 42 for connecting to the shield terminal 82. The contacting portions 42 may be formed in the shape of leaf springs that extend in the direction that is opposite of the direction of insertion of the coaxial cable 80, from the edge of each of the sidewall portions 41d. Additionally, the two contacting portions 42 may be disposed so as to face each other. When the coaxial cable 80 is inserted into the connector 1, the shield terminal 82 of the coaxial cable 80 may be inserted between the two contacting portions 42. In the contacting portions 42, the end portions thereof are pressed by the elastic forces thereof against the outer peripheral surface of the shield terminal 82. Doing so achieves an electrical connection between the shield line of the coaxial cable 80 and the ground terminal 4.

The first half-cylinder portion 41A and the second half-cylinder portion 41B may lock together, so that the separation thereof can be controlled. In the example illustrated in FIG. 8, a plurality of holes 41e is formed on the sidewall portion 41d of the second half-cylinder portion 41B. Other hand, a plurality of raised portions 41f that protrude towards the first half-cylinder portion 41A is formed on the sidewall portions 41b of the first half-cylinder portion 41A. When the first half-cylinder portion 41A and the second half-cylinder portion 41B are assembled together, the raised portions 41f fit into the sidewall portions 41d of the second half-cylinder portion 41B. Doing so controls the separation of the first half-cylinder portion 41A and the second half-cylinder portion 41B. Note that the raised portions 41f are formed through applying pressure to the sidewall portions 41d from the opposite side. As a result, recessed portions are shown on the opposite side from the raised portions 41f in FIG. 8.

As illustrated in FIG. 8, a plurality of locking portions 41i that are formed as hook shapes may be formed at the edges of the sidewall portions 41b of the first half-cylinder portion 41A. The first half-cylinder portion 41A and the second half-cylinder portion 41B, which are assembled together, may be pushed into the through holes 11a and 11b of the housing 11. Doing so causes the locking portions 41i to catch on the inner surfaces of the through holes 11a and 11b. Doing so also secures the ground terminal 4 to the housing 11.

Furthermore, as illustrated in FIG. 5 or 7(b), a bent-back portion 41 L bent back towards the main body portion 14 of the housing 11 and extends in the direction that is opposite from the direction of insertion of the coaxial cable 80 may be formed on the front edge of the bottom plate portion 41c of the second half-cylinder portion 41B. This bent-back portion 41 L may then fit into a recessed portion that is formed in the main body portion 14.

As described above, a plurality of conductor patterns 92 for grounds may be formed on the upper and lower faces of the circuit board 90. As illustrated in FIGS. 3-4, the conductor patterns 92 may be disposed to the left and the right of each of the signal conductor patterns 91. As illustrated in FIG. 7 or 8, each of the ground terminals 4 has a first ground connecting portion, or first connecting plate portion 43 and a second ground connecting portion, or second connecting plate portion 44 for connecting to a conductor pattern 92. In the present example, the ground terminal 4 has two first connecting plate portions 43, lined up on the left and the right, each formed in a long thin plate shape. Additionally, the ground terminal 4 has two second connecting plate portions 44 that, like the first connecting plate portions 43, are lined up on the left and the right, formed in the shape of long thin plates. As illustrated in FIG. 5, the first connecting plate portions 43 and the second connecting plate portions 44 extend in the direction of insertion of the coaxial cable 80 from mutually differing positions on the edge of the cylindrical main body 41, angled towards the surface of the circuit board 90 (that is, towards the horizontal plane P). Additionally, the first connecting plate portion 43 and the second connecting plate portion 44 preferably extend along the connecting plate portion 34 of the signal terminal 3. That is, the first connecting plate portion 43 and the second connecting plate portion 44 may be disposed so as to be roughly parallel to the connecting plate portion 34.

A slight gap may be provided between the two first connecting plate portions 43. Additionally, the second connecting plate portions 44 may be disposed separate in the left/right direction, where a gap is provided therebetween may be larger than the gap between the first connecting plate portions 43. The first connecting plate portions 43 and the second connecting plate portion 44 each preferably have contacting portions 43a and 44a, for contacting the conductor patterns 92, at each of the tip ends thereof. As shown in FIG. 3, the contacting portions 43a of the first connecting plate portions 43 and the contacting portions 44a of the second connecting plate portions 44 are preferably both attached to the individual conductor patterns 92.

As described above, the connecting plate portion 34 of the signal terminal 3 may also be angled towards the surface of the circuit board 90, and the connecting plate portions 34, 43 and 44 are all angled in the same direction. Additionally, the contacting portions 34a, 43a and 44a of the connecting plate portions 34, 43 and 44 may all be positioned on the same plane. That is, as illustrated in FIG. 3 or 5, the lengths of the connecting plate portions 34, 43 and 44 may be set so that the contacting portions 34a, 43a and 44a will all be in the same plane when the connector 1 is attached to the circuit board 90. Doing so makes it possible to cause the contacting portions 34a, 43a and 44a of the connecting plate portions 34, 43 and 44 to contact the conductor patterns 91 and 92 of the circuit board 90.

The first connecting plate portions 43 and the second connecting plate portions 44 are preferably in the shape of leaf springs. Because of this, the first connecting plate portions 43 and the second connecting plate portions 44 can elastically deform, with base portions 43b and 44a as fulcrums, changing the inclination thereof. The contacting portions 43a and 44a can move in the up/down direction through the elastic deformation of the connecting plate portions 43 and 44. When the connector 1 is attached to the edge 90a of the circuit board 90, the contacting portions 43a and 44a push against the conductor patterns 92 due to the elastic forces of the first connecting plate portion 43 and the second connecting plate portion 44, respectively. Note that the contacting portions 43a and 44a may merely press against the conductor patterns 92, or may be soldered to the conductor patterns 92.

Figure 10:
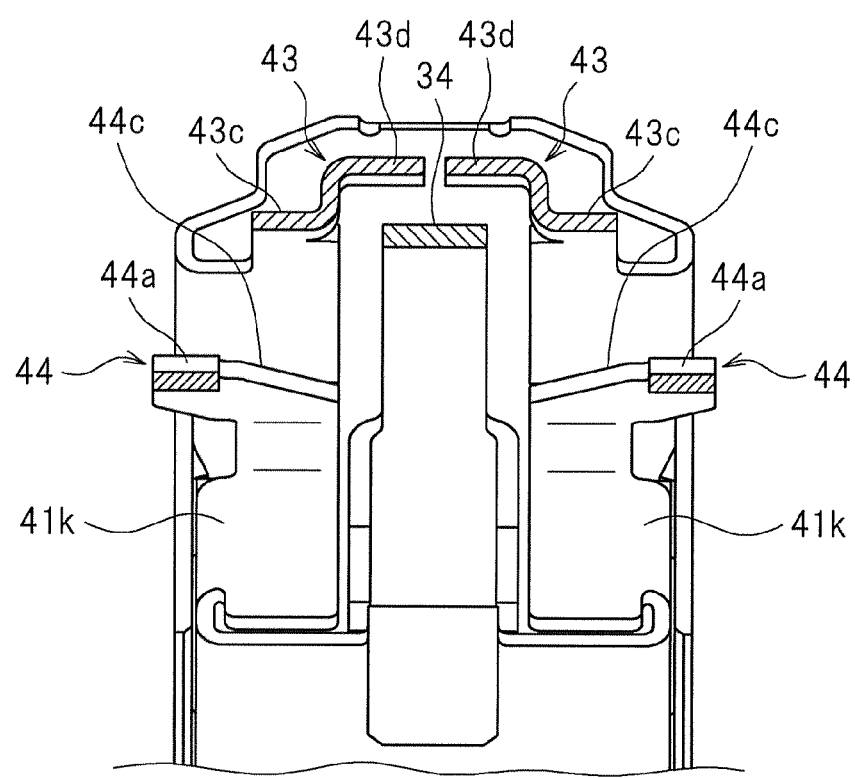
FIG. 10 is another cross-sectional view of the connector of FIG. 1, along Section X-X in FIG. 9.
Figure 11:
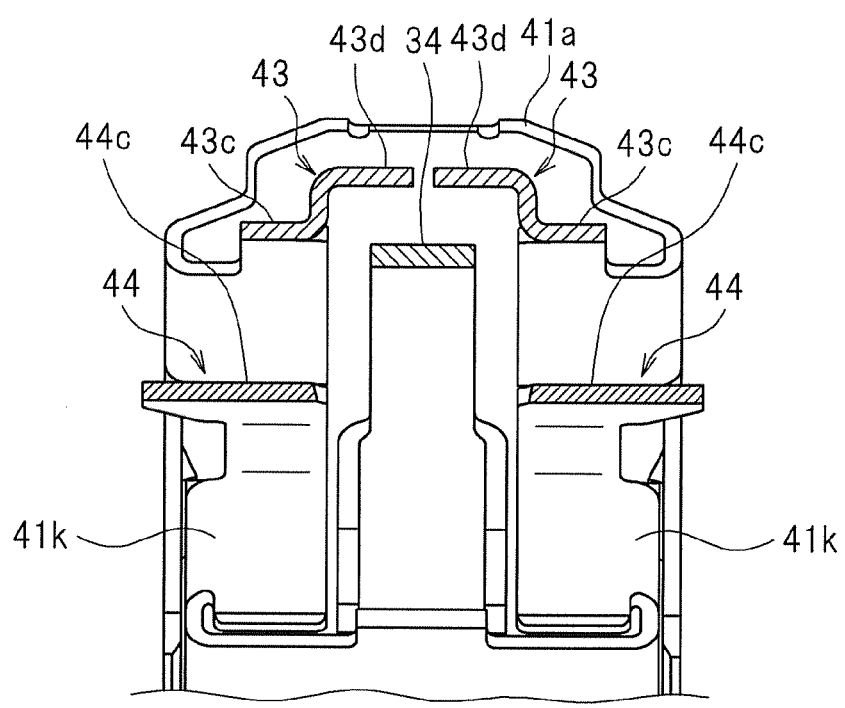
FIG. 11 is another cross-sectional view of the connector of FIG. 1, along Section XI-XI in FIG. 9.

As illustrated in FIG. 10 or 11, the first connecting plate portions 43 and the second connecting plate portions 44 may be disposed so as to face each other. In the present example, the first connecting plate portions 43 and the second connecting plate portions 44 are not only disposed so as to be roughly parallel, but also a gap is provided therebetween. Furthermore, the left and right first connecting plate portions 43 and the left and right second connecting plate portions 44, as a whole, encompass the connecting plate portion 34 of the signal terminal 3. In other words, the connecting plate portion 34 of the signal terminal 3 is disposed between the left and right first connecting plate portions 43 and the left and right second connecting plate portions 44. In the present example, the first connecting plate portions 43 extend to a position that is further from the surface of the circuit board 90 than that of the second connecting plate portions 44. In FIGS. 10 and 11, the first connecting plate portions 43 are positioned at positions that are higher than those of the second connecting plate portions 44. The connecting plate portion 34 of the signal terminal 3 is disposed at a position that is lower than that of the first connecting plate portions 43 and that is higher than that of the second connecting plate portions 44. As described above, a slight gap may be provided between the left and right first connecting plate portions 43, and the two second connecting plate portions 44 disposed separated in the left/right direction. The connecting plate portion 34 of the signal terminal 3 may be positioned below the gap between the left and right first connecting plate portions 43, and positioned above the gap between the left and right second connecting plate portions 44.

As described above, the ground terminal 4 preferably has a first half-cylinder portion 41A and a second half-cylinder portion 41B. As illustrated in FIG. 8, the first connecting plate portions 43 are formed in the first half-cylinder portion 41A. In the present example, the first connecting plate portions 43 extend from the ceiling plate portion 41a of the first half-cylinder portion 41A, angled towards the conductor pattern 92 of the circuit board 90. In more detail, the ceiling plate portion 41a has a pair of bent-back portions 41j pulled out from the left and right edges of the forward most portion of the ceiling plate portion 41a. The bent-back portions 41j are bent back towards the inside from the left and right edges of the ceiling plate portion 41a, and positioned below the furthest forward portion of the ceiling plate portion 41a. The first connecting plate portions 43 extend from the front edges of the bent-back portions 41j.

As illustrated in FIG. 8 or 11, the first connecting plate portions 43 preferably have side portions, or side plate portions 43c, positioned at the left and right of the connecting plate portion 34 of the signal terminal 3. The side plate portions 43c preferably extend towards the connecting plate portions 34 of the signal terminal 3 from the base portion 43b (the portion connected to the bent-back portion 41j) of the first connecting plate portion 43. The left and right side plate portions 43c may be disposed so as to be coplanar, and the connecting plate portion 34 of the signal terminal 3 disposed therebetween. In the present example, the side plate portions 43c are positioned roughly in the same plane as the connecting plate portion 34 of the signal terminal 3. Note that the contacting portions 43a attached to the conductor patterns 92 of the circuit board 90 are provided at the tip ends of the side plate portions 43c.

As illustrated in FIGS. 8 and 11, the first connecting plate portions 43 may cover the connecting plate portions 34 of the signal terminal 3 from above. In the present example, the left and right first connecting plate portions 43 have top plate portions 43d pulled out to the inside from the side plate portions 43c thereof. The left and right top plate portions 43d are each formed in essentially square plate shapes, and disposed so as to be roughly coplanar. The connecting plate portion 34 of the signal terminal 3 is covered by the left and right top plate portions 43d. In other words, the left and right top plate portions 43d and the connecting plate portion 34 of the signal terminal 3 face each other in the direction of thickness thereof. Note that the side plate portions 43c and the top plate portions 43d are connected through a step difference.

Figure 9:
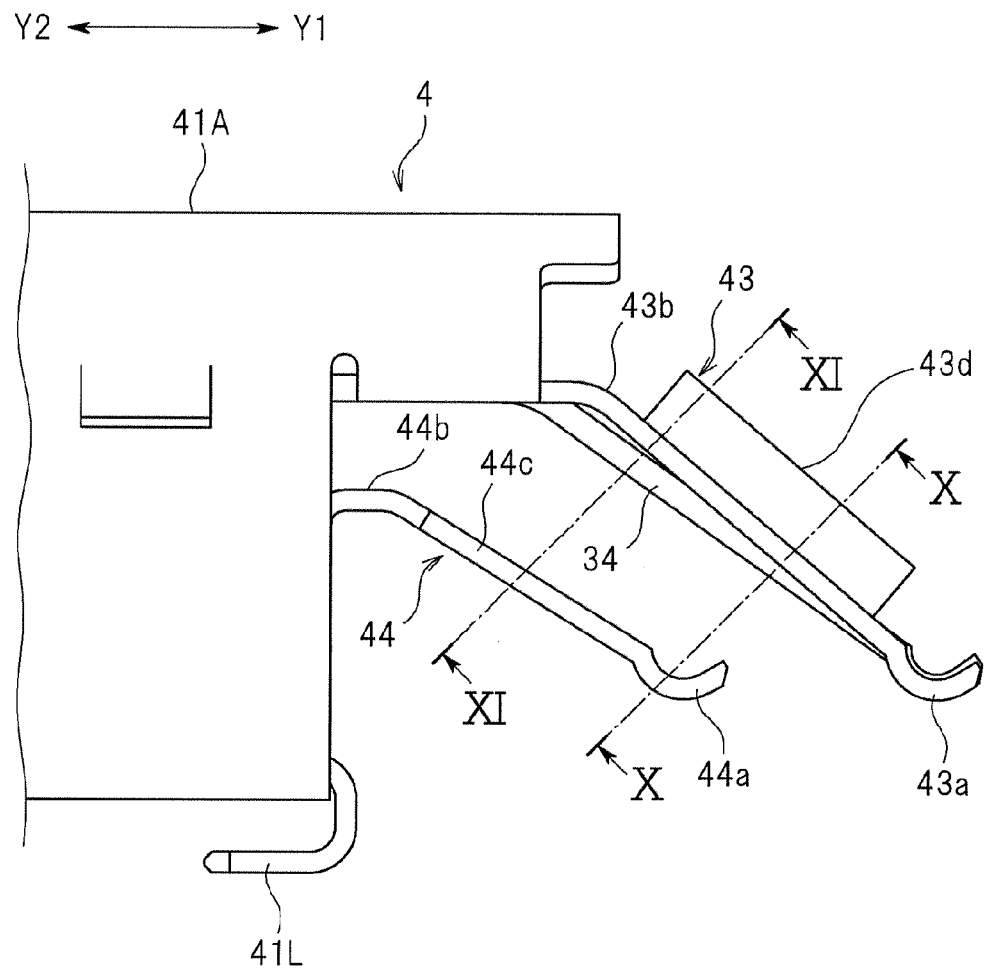
FIG. 9 is a side view of the connector of FIG. 1.

As illustrated in FIG. 5 or 9, the second connecting plate portions 44 may extend from positions lower than those of the first connecting plate portions 43 and the connecting plate portion 34 of the signal terminal 3; that is, from positions nearer to the surface of the circuit board 90 than those of the connecting plate portions 43 and 34. As illustrated in FIG. 8, second connecting plate portions 44 are formed in the second half-cylinder portion 41B. In the present example, the cylindrical main body 41 is in the shape of a cylinder open in the front/back direction (the direction of insertion of the coaxial cable 80, and the lengthwise direction of the cylindrical main body 41). The second half-cylinder portion 41B has left and right front wall portions 41k formed so as to block a portion of the opening of the cylindrical main body 41 at the end portion thereof. The front wall portions 41k extend towards the inside from the front edge of the sidewall portions 41d of the second half-cylinder portion 41B, disposed so that the normal lines thereof face in the lengthwise direction of the cylindrical main body 41. The second connecting plate portions 44 extend from the top edges of the front wall portions 41k, angled towards the conductor patterns 92 on the circuit board 90.

As illustrated in FIG. 5, the bottom plate portions 41c of the second half-cylinder portion 41B are preferably positioned at positions lower than the surface of the circuit board 90. Thus, the bottom plate portions 41c of the second half-cylinder portion 41B are more proximate to the horizontal plane P than the surface of the circuit board 90. Also, the top edges of the front wall portions 41k are preferably positioned more separate from the horizontal plane P then is the surface of the circuit board 90. The base portions 44b of the second connecting plate portions 44 may be connected to the top edges of the front wall portions 41k. In this way, the use of the front wall portions 41k narrows the distance between the top side through holes 11a and the bottom side through holes 11b, to suppress the thickness (height) of the connector 1, while also providing space for the disposal of the circuit board 90 between the second connecting plate portion 44 of the ground terminal 4 inserted into the top side through hole 11a and the second connecting plate portion 44 of the ground terminal 4 inserted into the bottom side through hole 11b.

As illustrated in FIG. 8, the second connecting plate portions 44 preferably have bottom plate portions 44c extending from the base portions 44b and are wider than the base portions 44b. As illustrated in FIG. 11, the bottom plate portions 44c are disposed so as to face the side plate portions 43c of the first connecting plate portions 43. Additionally, the bottom plate portions 44c are wider than the side plate portions 43c, and the left and right edges 44d of the bottom plate portions 44c are positioned further to the outsides, in the left/right direction, than the edges 43e of the left and right side plate portions 43c. Because the connecting plate portion 34 of the signal terminal 3 is encompassed by the left and right second connecting plate portions 44 and the left and right first connecting plate portions 43, the return electric current can flow back easily into the ground terminal 4. Because of this, the electric current that flows in the signal terminal 3 and the return electric current cancel each other out, making it possible to suppress the common mode electric current. The result is a suppression of the occurrence of crosstalk, and a suppression of the occurrence of noise in the signals the flow in the signal paths of the circuit board 90.

Note that, as illustrated in FIG. 11, a gap is provided between the left and right lower plate portions 44c larger than the width of the connecting plate portion 34 of the signal terminal 3. Additionally, the distance from the bottom plate portion 44c to the connecting plate portion 34 of the signal terminal 3 in a state wherein the connector 1 is not attached to the circuit board 90 may be larger than the distances from the top plate portions 43d and the side plate portions 43c to the connecting plate portion 34.

As illustrated in FIG. 8, contacting portions 44a are formed on the tip ends of the bottom plate portions 44c. As illustrated in FIG. 4, the gap between the left and right contacting portions 44a is larger than that between the contacting portions 43a of the left and right first connecting plate portions 43. That is, the left and right contacting portions 44a are positioned further to the outside than the contacting portions 43a in the left/right direction. Because of this, when the first connecting plate portions 43 and the second connecting plate portions 44 are viewed in the plan view, the contacting portions 44a and the contacting portions 43a do not overlap. The result is that it becomes possible to discern with ease whether or not the individual contacting portions 43a and 44a are connected to the conductor patterns 92 properly.

The first half-cylinder portion 41A and the second half-cylinder portion 41B are preferably formed through a press process. For example, first materials may be formed respectively in shapes wherein the first half-cylinder portion 41A and second half-cylinder portion 41B are laid out flat. These materials may then be formed into the first half-cylinder portion 41A and the second half-cylinder portion 41B by bending at a plurality of positions. In the present example, as illustrated in FIG. 8, the material shaped as the first half-cylinder portion 41A laid flat may be bent in the downward direction at the edges of the ceiling plate portion 41a to form the left and right sidewall portions 41b. Additionally, the left and right bent-back portions 41j may be bent back towards the inside. Then, the front edges of the bent-back portions 41j may be bent to incline the first connecting plate portions 43. Both the first half-cylinder portion 41A and the second half-cylinder portion 41B may be formed in this way. In this process, a variety of steps may be used, depending on the sizes and shapes of the half-cylinder portions 41A and 41B, the bent-back portions 41j and the connecting plate portions 43 and 44.

As described above with reference to FIG. 2, in the housing 11, through holes 11a are preferably formed on the side above the horizontal plane P, and through holes 11b on the side below the horizontal plane P. As illustrated in FIG. 5, a plurality of first ground terminals 4 and signal terminals 3 is preferably inserted into the top side through holes 11a, and a plurality of second ground terminals 4 and signal terminals inserted into the bottom side through holes 11b is positioned so as to be symmetric therewithin regards to the horizontal plane P. Because of this, the connecting plate portions 43, 44 and 34 of the terminals 4 and 3 lined up in the left/right direction on the top side of the horizontal plane P and the connecting plate portions 43, 44 and 34 of the terminals 4 and 3 lined up in the left/right direction on the bottom side of the horizontal plane P face each other in the up/down direction. Additionally, the connecting plate portions 43, 44 and 34 of the top side terminals 4 and 3 and the connecting plate portions 43, 44 and 34 of the bottom side terminals 4 and 3 are inclined so that the gaps therebetween are smaller the nearer towards the tip ends thereof. Additionally, the gaps between the contacting portions 34a, 44a and 34a of the top side terminals 4 and 3 and the contacting portions 43a, 44a and 34a of the bottom side terminals 4 and 3 are narrower than the thickness of the circuit board 90. The circuit board 90 is preferably gripped by the connecting plate portions 43, 44 and 34 of the top side terminals 4 and 3 and the connecting plate portions 43, 44 and 34 of the bottom side terminals 4 and 3. The connector 1 may be connected to the edge 90a of the circuit board 90 in this way.

Note that as illustrated in FIG. 2, the housing 11 has attaching portions 12 that protrude in the forward direction (the direction indicated by Y1) from the left and right edge portions of the main body portion 14. Each attaching portion 12 preferably has a top protruding portion 12a and a bottom protruding portion 12b formed so as to face each other in the up/down direction. The attaching portions 12 are preferably secured to the circuit board 90 in a state wherein the circuit board 90 is held between the top protruding portions 12a and the bottom protruding portions 12b. For example, the attaching portion 12 is secured to the circuit board 90 through a screw, rivet, press-fit pin or the like, being inserted into a hole 12c formed in the top protruding portion 12a and a hole formed in the circuit board 90.

A semiconductor 101 subject to testing is preferably installed in a device socket 102 disposed on a performance board 103. A plurality of connectors 113 may be attached to the lower face of the performance board 103. The circuit board testing device 100 may be provided with a motherboard that includes a plurality of coaxial cables 80, where a plurality of holders 114 is preferably provided at the top portion of the motherboard 104. Each holder 114 may hold a signal terminal and a shield terminal provided at the top end of an aforementioned coaxial cable 80. When the performance board 103 is disposed on the motherboard 104, the signal terminal and the shield terminal of the coaxial cable 80 are preferably inserted into the connector 113. Additionally, a plurality of holders 116 may be disposed at the bottom portion of the motherboard 104. The aforementioned signal terminal 81 and shield terminal 82 may be provided at the bottom end of the coaxial cable 80. Each holder 116 may hold a signal terminal 81 and a shield terminal 82.

The semiconductor testing device 100 is preferably provided with a test head 105 having the aforementioned circuit board 90. The test head 105 preferably has a plurality of circuit boards 90 disposed in an upright state. A connector 1 may be attached to the top edge of each circuit board 90. When the motherboard 104 is disposed on the test head 105, the signal terminal 81 and the shield terminal 82 provided at the bottom end of a coaxial cable 80 may be inserted into each connector 1. The circuit board 90 is preferably connected to a testing device main unit 107 to produce test signals in accordance with instructions received from the testing device main unit 107 to be outputted to the semiconductor 101.

As explained above, in the connector 1, each ground terminal 4 may be provided with two first connecting plate portions 43 and two second connecting plate portions 44. Additionally, the connecting plate portions 43 and 44 may each extend from mutually differing positions on the edge of the cylindrical main body 41, and disposed so that, as a whole, they encompass the connecting plate portion 34 of the signal terminal 3. Because of this, the return electric current flow into the ground terminal 4 can be facilitated, and the electric current that flows in the signal terminal 3 and the return electric current can cancel each other out, thereby enabling the suppression of the common mode electric current. The result is a suppression of crosstalk.

Note that the Present Disclosure is not limited to the connector 1 and the semiconductor testing device 100 set forth above, but rather can be modified in a variety of ways. As an example, as explained above, the ground terminal 4 had four connecting plate portions: two first connecting plate portions 43 and two second connecting plate portions 44. However, the ground terminal 4 may instead have only three connecting plate portions. For example, the ground terminal 4 may have a connecting plate portion disposed directly above the connecting plate portion 34 of the signal terminal 3, and the aforementioned two second connecting plate portions 44. The connecting plate portion 34 of the signal terminal 3 may be encompassed by the connecting plate portions of the ground terminal 4 in this configuration as well, thus making it possible to achieve an improvement in the crosstalk suppression and in impedance matching relative to the conventional structure. Additionally, the ground terminal 4 may be provided with more than two first connecting plate portions 43 and second connecting plate portions 44.

Additionally, as described above, the cylindrical main body 41 of the ground terminal 4 was structured through two members that were structured separately (that is, the first half-cylinder portion 41A and the second half-cylinder portion 41B). However, the cylindrical main body 41 may instead be structured monolithically. That is, the cylindrical main body 41 may be structured through bending a single plate-shaped member into a cylinder. Further, in the explanation set forth above, the connector 1 had a ground terminal 4 and a signal terminal 3 that faced each other with the horizontal plane P interposed therebetween. That is, the ground terminals 4 and the signal terminals 3 were disposed on both the top side and the bottom side of the connector 1. However, the Present Disclosure may also be applied to a connector having ground terminals 4 and signal terminals 3 on only one side of the horizontal plane P.

While a preferred embodiment of the Present Disclosure is shown and described, it is envisioned that those skilled in the art may devise various modifications without departing from the spirit and scope of the foregoing Description and the appended Claims.

What is claimed is:

1. A connector that is attached to a circuit board and wherein a coaxial cable can be inserted in a direction along the surface of the circuit board, comprising:
  a ground terminal having a cylindrical main body disposed so that the centerline thereof faces the direction of insertion of the coaxial cable; and
  a signal terminal having a signal terminal main body that is disposed within the cylindrical main body, and a signal connecting portion that is a connecting portion for connecting to the circuit board, extending from an end portion of the signal terminal main body;
  wherein the ground terminal has at least three ground connecting portions, for connecting to the circuit board, each extending from mutually differing positions on the edge of the cylindrical main body, and are disposed so as to encompass the signal connecting portion.

2. The connector of claim 1, wherein the ground terminal has at least three ground connecting portions, having two first ground connecting portions that are formed in plate shapes, and two second ground connecting portions that are formed in plate shapes that face the two first ground connecting portions.

3. The connector of claim 2, wherein the signal connecting portion is disposed between the two first ground connecting portions and the two second ground connecting portions.

4. The connector of claim 3, wherein the two first ground connecting portions extend from positions that are further separated from the surface of the circuit board than the two second ground connecting portions, and cover the signal connecting portion.

5. The connector of claim 4, wherein the two first ground connecting portions have side portions that extend along the signal connecting portion, positioned to the left and right of the signal connecting portion.

6. The connector of claim 3, wherein the two second ground connecting portions extend from positions nearer to the surface of the circuit board than that of the two first ground connecting portions.

7. The connector of claim 6, wherein the left and right edges of the two second ground connecting portions are positioned further to the outside than the left and right edges of the two first ground connecting portions.

8. The connector of claim 7, wherein the gap between the tip ends of the two second ground connecting portions is larger than the gap between the tip ends of the two first ground connecting portions.

9. The connector of claim 3, wherein the cylindrical main body includes a first half-cylinder portion and a second half-cylinder portion that are assembled together in the radial direction of the cylindrical main body to form a cylinder.

10. The connector of claim 9, wherein the first ground connecting portion is formed in the first half-cylinder portion.

11. The connector of claim 10, wherein the second ground connecting portion is formed in the second half-cylinder portion.

12. The connector of claim 1, wherein the cylindrical main body of the ground terminal has a wall portion that blocks at least a portion of an opening of the cylindrical main body.

13. A semiconductor inspecting device, comprising:
  a connector comprising:
    a ground terminal having a cylindrical main body disposed so that the centerline thereof faces the direction of insertion of the coaxial cable; and
    a signal terminal having a signal terminal main body that is disposed within the cylindrical main body, and a signal connecting portion that is a connecting portion for connecting to the circuit board, extending from an end portion of the signal terminal main body;
    wherein the ground terminal has at least three ground connecting portions, for connecting to the circuit board, each extending from mutually differing positions on the edge of the cylindrical main body, and are disposed so as to encompass the signal connecting portion; and
  a circuit board.

14. The semiconductor inspecting device of claim 13, wherein the connector has, as the ground terminal, a plurality of first ground terminals and a plurality of second ground terminals.

15. The semiconductor inspecting device of claim 14, wherein an edge of the circuit board is held between the at least three ground connecting portions possessed by each of the plurality of first ground terminals and the at least three ground connecting portions possessed by each of the plurality of second ground terminals.

\* \* \* \* \*